United States Patent [19]

Sugawara

[11] Patent Number: 5,055,708
[45] Date of Patent: Oct. 8, 1991

[54] CIRCUIT FOR DRIVING AN INDUCTIVE LOAD

[75] Inventor: Mitsutoshi Sugawara, Tokyo, Japan

[73] Assignee: NEC Corporation, Tokyo, Japan

[21] Appl. No.: 456,675

[22] Filed: Dec. 27, 1989

[30] Foreign Application Priority Data

Dec. 28, 1988 [JP] Japan .................... 63-334539

[51] Int. Cl.$^5$ .......... H03K 3/01; H03K 5/26; H03B 1/00; H03B 19/00
[52] U.S. Cl. .................. 307/270; 307/516; 307/520; 328/14
[58] Field of Search ........ 328/14, 33; 307/270, 307/571, 523, 253, 516, 520

[56] References Cited

U.S. PATENT DOCUMENTS 4,153,882  5/1979  Fisher et al. .................. 328/14

OTHER PUBLICATIONS

Matsuya et al, "A 17-bit Oversampling D-to-Conversion Technology Using Multistage Noise Shaping", IEEE Journal of Solid-State Circuits, vol. 24, No. 4, Aug. 1989, pp. 969-975.
Stikvoort, "Some Remarks on the Stability and Performance of the Noise Shaper Or Sigma-Delta Modulator", IEEE Transactions on Communications, vol. 36, No. 10, Oct. 1988, pp. 1157-1162.
Naus et al, "A CMOS Stereo 16-bit D/A Converter for Digital Audio", IEEE Journal of Solid-State Circuits, vol. SC 22, No. 3, Jun. 1987, pp. 390-395.
Koch et al, "A 120 kHz Sigma/Delta A/D Converter", IEEE International Solid-State Circuits Conference 1986, pp. 138-139.
Rebeschini et al, "A 16-Bit 160 kHz CMOS A/D Converter Using Sigma-Delta Modulation", pp. 6.1.1-6.1.5.

Primary Examiner—Stanley D. Miller
Assistant Examiner—Trong Phan
Attorney, Agent, or Firm—Helfgott & Karas

[57] ABSTRACT

A switching transistor for driving an inductive load is switched on and off by a switching signal of a PWM signal or a signal equivalent to the PWM Signal. A frequency band of impulse noise components of the switching signal is above a frequency band used in an apparatus including the inductive load.

5 Claims, 4 Drawing Sheets

FIG.I PRIOR ART
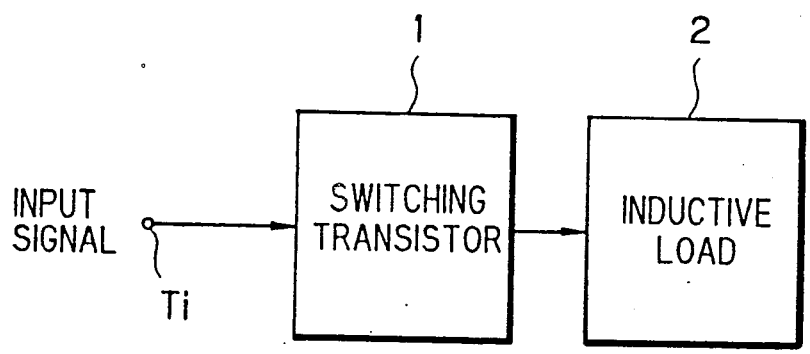
FIG. 2 PRIOR ART
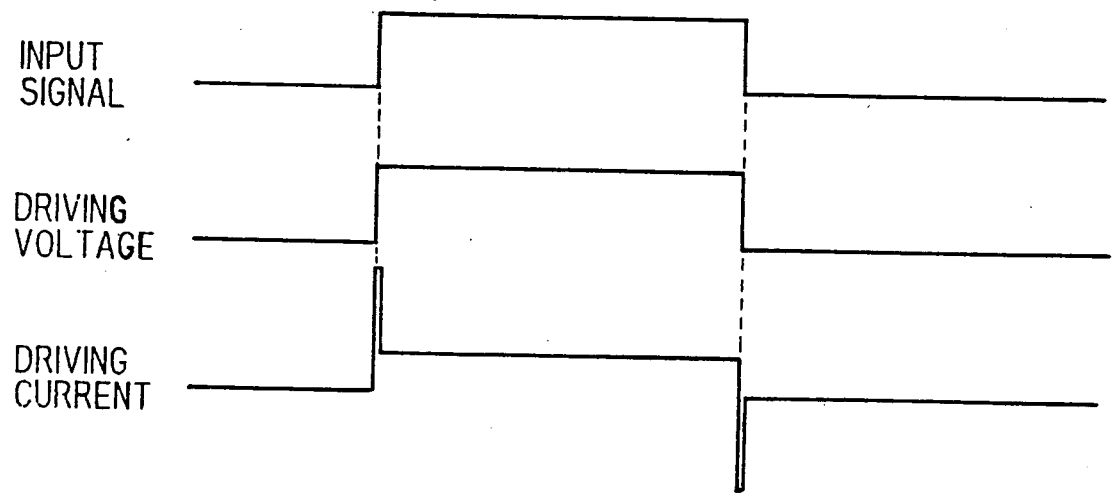

CIRCUIT FOR DRIVING AN INDUCTIVE LOAD

FIELD OF THE INVENTION

This invention relates to a circuit for driving an inductive load, and more particularly to a circuit for driving an inductive load such as a motor, a relay, and the like by use of a switching transistor.

BACKGROUND OF THE INVENTION

One type of a conventional circuit for driving an inductive load comprises a switching transistor, to which an input signal is applied.

In operation, the input signal is applied to the switching transistor, thereby being switched on, so that a driving voltage is applied across the inductive load. Thus, the inductive load is driven, so that a driving current flows through the inductive load. In this driving circuit, there is an advantage in that less power consumption is realized, because D-class amplification is carried out in the switching transistor.

However, this conventional circuit for driving an inductive circuit has a disadvantage in that the driving current includes impulse noise which is resulted from the differential of the driving voltage. The impulse noise includes harmonic components.

A motor is used for driving a magnetic recording medium in a magnetic recording and reproducing apparatus such as a tape recorder, a VTR, a magnetic disc, and the like. In such a use, the motor is turned on and off, is changed in its polarity, and is controlled in its velocity by use of a pulse width modulation (PWM). In such a case, the aforementioned impulse noise is liable to be produced in a driving current at the time of the turning on and off of the motor. The impulse noise is introduced into a magnetic head, a wiring of an input circuit, etc. in the magnetic recording and reproducing apparatus, so that the impulse noise appears as harmonic noise at a frequency band used therein at the time of reproducing information recorded in the magnetic recording medium, thereby decreasing a S/N ratio.

For avoiding this disadvantage, a capacitor is connected in parallel with the motor to decrease the harmonic noise. However, this is not sufficient to overcome this disadvantage, because the provision of the capacitor is no more than one-order low pass filter.

In this circumstance, another type of a circuit for driving an inductive load is used, for instance, in the magnetic recording and reproducing apparatus. The circuit for driving an inductive load comprises a low pass filter for relaxing a steep rise and a steep fall of an input signal, and a power amplifier for amplifying the input signal thus relaxed at the rise and the fall thereof.

In operation, the input signal is supplied to the low pass filter, so that the input signal is relaxed at the rise and the fall thereof. Then, the relaxed input signal is amplified in the power amplifier to produce an amplified driving voltage which is applied across the motor, so that the motor is turned on and off to drive the magnetic recording medium. In this circuit for driving an inductive load, the amplified driving voltage rises up with a relaxed rise, so that a driving current flowing through the motor in the application of the driving voltage is suppressed in its peak value, because the driving current is defined by differentiating the driving voltage. Consequently, harmonic components are decreased in the driving current, and a S/N ratio is increased.

However, the latter type of the conventional circuit for driving an inductive load has disadvantages in that it is expensive due to the inclusion of the power amplifier, and a power consumption is increased, because the power amplifier is switched on and off in analog operation with the modulated rise and fall of the input signal.

SUMMARY OF THE INVENTION

Accordingly, it is an object of this invention to provide a circuit for driving an inductive load in which the occurrence of noise is suppressed at the time of switching on and off.

It is further object of this invention to provide a circuit for driving an inductive load in which switching on and off is carried out in digital operation without the occurrence of noise.

It is a still further object of this invention to provide a circuit for driving an inductive load, a cost of which is lowered, and a power consumption in which is decreased.

According to this invention, a circuit for driving an inductive load, comprises:

means for supplying an input signal to an input terminal, the input signal being an instruction signal for driving the inductive load;

means for generating a high speed clock signal which has a predetermined sampling rate;

means for generating a switching signal selected from a pulse width modulation signal and a signal equivalent to the pulse width modulation signal in accordance with the high speed clock signal at the time of a rise and a fall of the input signal; and a switching transistor which is turned on and off to drive the inductive load as said transistor receives the switching signal.

According to this invention, an input signal is subject to a digital filtering processing (low pass filtering processing) at a rise and a fall thereof in accordance with a high speed clock of a frequency more than twice a frequency band used, for instance, in a magnetic recording and reproducing apparatus. As a result, harmonic noise components are removed from a driving current. The input signal thus processed is then subject to a $\Delta\Sigma$ modulation processing, so that a PWM signal, in which impulse noise components are expelled to a frequency band of more than Nyquist frequency harmless for noise disturbance, is obtained. Thus, D-class operation of a switching transistor is effected by use of the PWM signal, so that a power consumption is suppressed substantially to be equal to zero.

BRIEF DESCRIPTION OF THE DRAWINGS

This invention will be explained in more detail in conjunction with appended drawings, wherein:

FIG. 1 is a block diagram showing the aforementioned former type of the conventional circuit for driving an inductive load, FIG. 2 is a timing chart showing operation in the former type of the conventional circuit for driving an inductive load.

DETAILED DESCRIPTION OF THE PREFERRED EMBODIMENTS

Before explaining the circuit for driving an inductive load in the first preferred embodiment according to the invention, the aforementioned former and latter types of the conventional circuits for driving an inductive load will be again explained briefly in FIGS. 1 to 4.

FIG. 1 shows the former type of the conventional circuit for driving an inductive load which comprises an input terminal Ti, to which an input signal is applied, a switching transistor which is switched on and off in the presence and non-presence of the input signal applied to the input terminal Ti, and an inductive load 2 such as a motor, a relay, and the like which is driven upon the switching on of the switching transistor 1.

FIG. 2 shows the input signal applied to the input terminal Ti, a driving voltage applied across the motor, and a driving current flowing through the motor.

In operation, the input signal is applied to the input terminal Ti, so that the switching transistor 1 is switched on to apply the driving voltage across the motor. Thus, the motor is driven with the driving current flowing therethrough.

As described before, impulse noise which is resulted from the differential of the driving voltage is produced at the time of a rise and a fall of the driving current.

Figure 3:
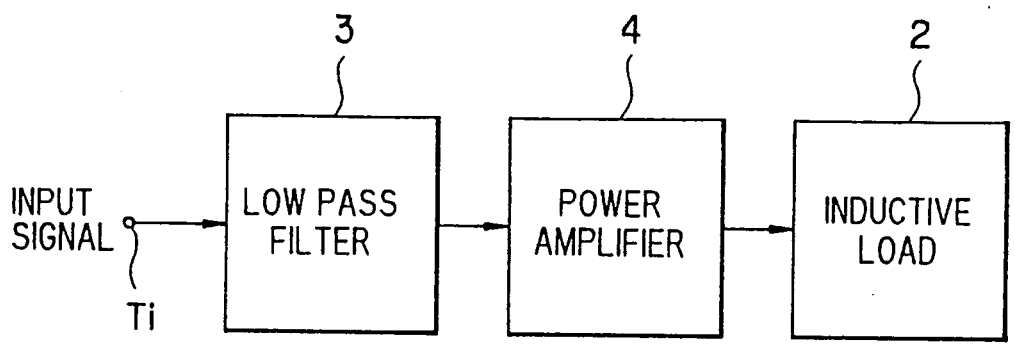
FIG. 3 is a block diagram showing the aforementioned latter type of the conventional circuit for driving an inductive load.

FIG. 3 shows the latter type of the conventional circuit for driving an inductive load which comprises an input terminal Ti, to which an input signal is applied, a low pass filter 3 for relaxing a steep rise and a steep fall of the input signal, and a power amplifier 4 for amplifying the relaxed input signal to produce a driving voltage applied across the inductive load 2.

Figure 4:
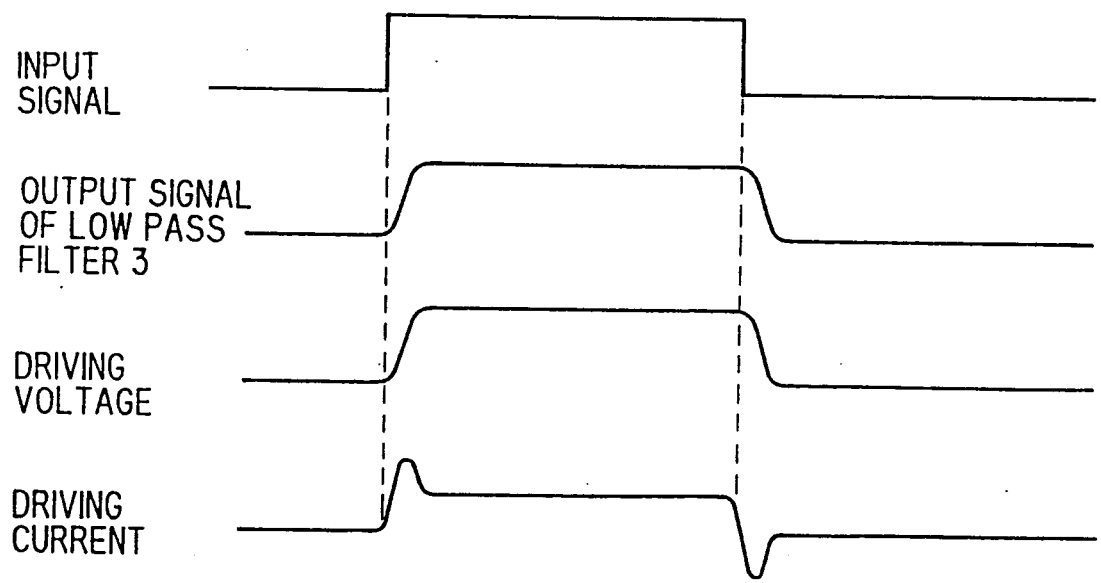
FIG. 4 is a timing chart showing operation in the latter type of the conventional circuit for driving an inductive load.

FIG. 4 shows the input signal applied to the input terminal Ti, an output signal of the low pass filter 3 which is relaxed therein at the time of a rise and a fall thereof, the driving voltage obtained in accordance with an amplification of the relaxed input signal, and a driving current flowing through the inductive load 2.

In operation, the input signal is applied to the input terminal Ti, so that it is relaxed at the rise and the fall as shown in FIG. 4 by the output signal of the low pass filter 3. The relaxed signal is amplified in the power amplifier 4 to be the driving voltage which is applied across the inductive load 2. Thus, the inductive load 2 is driven with the driving current flowing therethrough. The peak values of the driving current are suppressed not to include harmonic components. As a result, the decrease of a S/N ratio is avoided.

The disadvantages found in the former and latter types of the conventional circuits for driving an inductive load are not explained here, because they were explained before.

Figure 5:
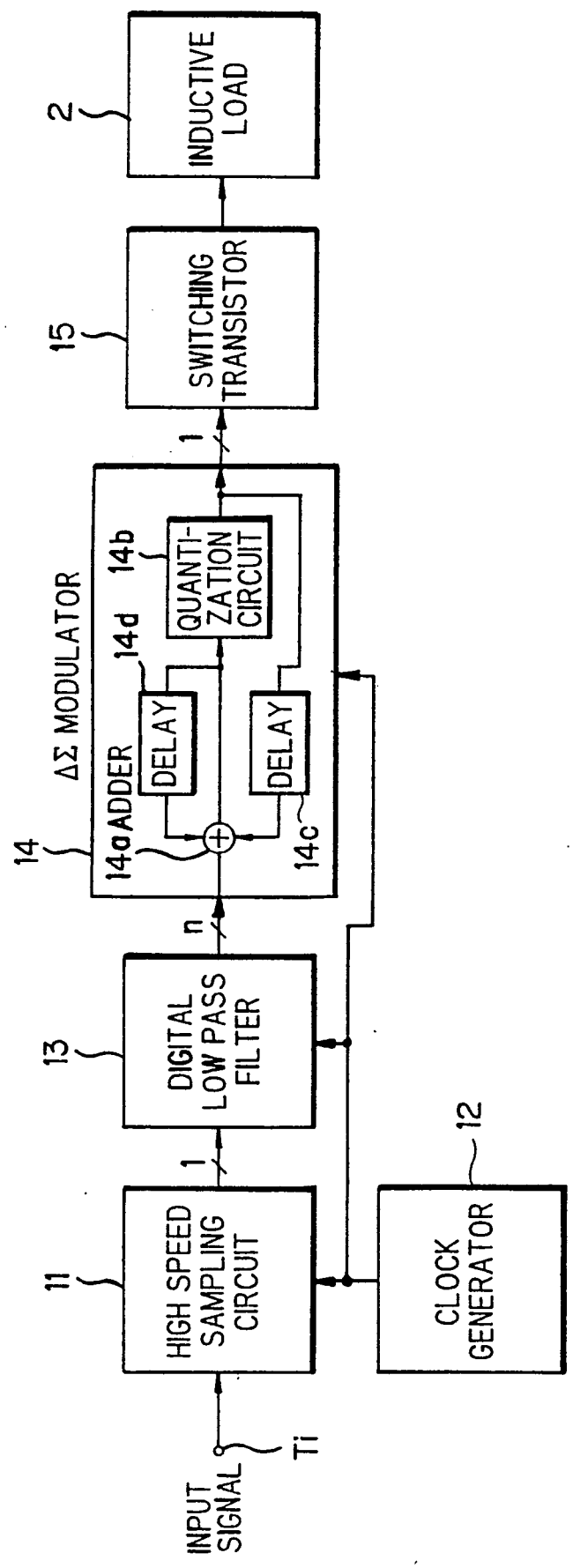
FIG. 5 is a block diagram showing a circuit for driving an inductive load in a first preferred embodiment according to the invention.

Next, a circuit for driving an inductive load in the first preferred embodiment according to the invention will be explained in FIG. 5. The circuit for driving an inductive load comprises a high speed sampling circuit 11 for receiving an input signal from an input terminal Ti, a digital low pass filter 13 for removing harmonic components of a predetermined frequency band from a train of pulses supplied from the high speed sampling circuit 11, a $\Delta\Sigma$ modulator 14 for quantizing a multi-bit output signal supplied from the low pass filter 13 to be a one-bit signal as a PWM signal, a switching transistor 15 which is switched on by the output signal of the $\Delta\Sigma$ modulator 14, an inductive load 2, to which a driving voltage is applied in accordance with the switching on of the switching transistor 15, and a clock generator 12 for supplying a high speed clock signal in accordance with a sampling rate to the high speed sampling circuit 11, the digital low pass filter 13, and the $\Delta\Sigma$ modulator 14. The $\Delta\Sigma$ modulator 14 includes an adder 14a, a quantization circuit 14b for quantizing an output signal of the adder 14a to be the one-bit signal, a first delay circuit 14c for supplying the one-bit signal to the adder 14a in the delay of a predetermined time, and a second delay circuit 14d for supplying the output signal of the adder 14a to the adder 14a in the delay of a predetermined time.

Figure 6:
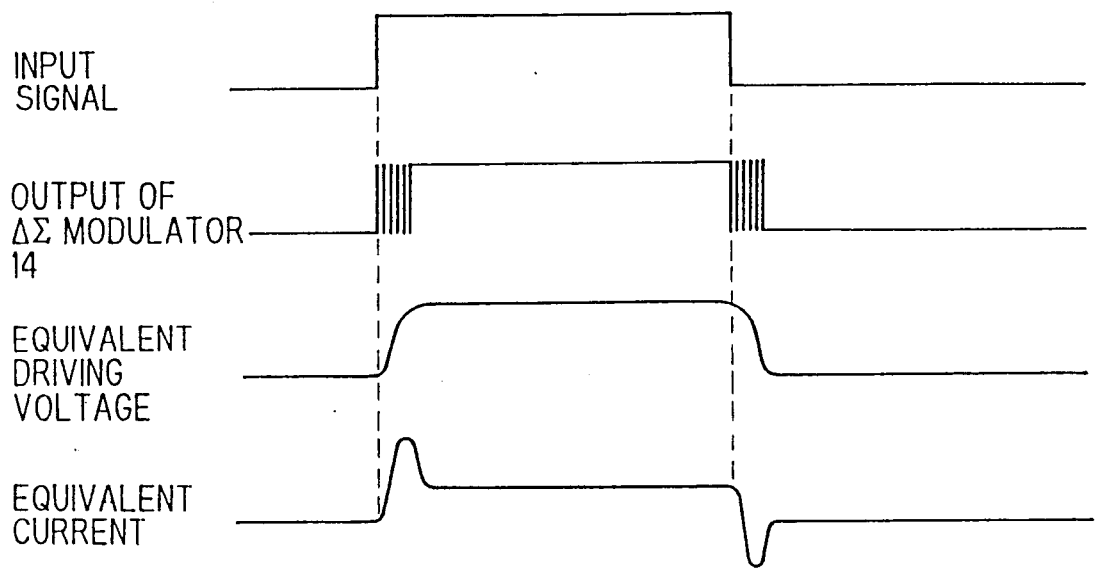
FIG. 6 is a timing chart showing operation in the circuit for driving an inductive load in the first preferred embodiment.

Operation of the circuit for driving an inductive load in the first preferred embodiment will now be explained in FIG. 6.

The input signal is applied to the input terminal Ti to be supplied to the high speed sampling circuit 11, in which the input signal is sampled in accordance with the clock signal of the clock generator 12, so that a pulse train composed of logic levels "0" and "1" is supplied from the high speed sampling circuit 11 to the digital low pass filter 13. The harmonic components having a frequency band which deteriorates a S/N ratio, for instance, in a magnetic recording and reproducing apparatus are removed from the pulse train in the digital low pass filter 13 operating in accordance with the clock signal. The output signal of the digital low pass filter 13 is of a multi-bit signal which is supplied to the adder 14a of the $\Delta\Sigma$ modulator 14, an output signal of which is quantized to be the one-bit signal in the quantization circuit 14b. The one-bit signal of the quantization circuit 14b is delayed to be supplied to the adder 14a by the first delay circuit 14c, and the output signal of the adder 14a is delayed to be supplied to the adder 14a by the second delay circuit 14d. Thus, the quantization is repeated in the $\Delta\Sigma$ modulator 14 in accordance with the high speed clock signals of the clock generator 12. If it is assumed that the sampling frequency is set to be more than twice a frequency band used, for instance, in the magnetic recording and reproducing apparatus, a digital signal is obtained at less than Nyquist frequency as shown in FIG. 6 by an output of the $\Delta\Sigma$ modulator 14. For this purpose, the sampling frequency is preferably more than ten times the used frequency band to increase the filtering effect. The digital signal is of a pulse width modulation (PWM) signal which is applied to the switching transistor 15. As a result, the switching transistor 15 is switched on to apply a driving voltage across the inductive load 2. In this situation, a switching operation is only effected in the switching transistor 15. That is, D-class amplification is carried out. This means that no power is consumed, and the circuit for driving an inductive load can be small and inexpensive. At the input terminals of the inductive load 2, across which a driving voltage is applied, the wave shape of the driving voltage becomes a wave shape as shown in FIG. 6 by an equivalent driving voltage, a frequency of which is limited to be less than Nyquist frequency (half the frequency of the clock signal). This wave shape is substantially identical to one which was shown in FIG. 4 by the driving voltage. Consequently, a driving current flows through the inductive load 2 as shown in FIG. 6 by an equivalent current. In other words, impulse noise components are distributed above Nyquist frequency. This means that the frequency band of the impulse noise components is expelled to a frequency band above the frequency band used, for instance, in the magnetic recording and reproducing apparatus. The expelled impulse noise components may be absorbed in the provision of a capacitor which is connected in parallel to the inductive load 2, although no noise disturbance occurs, because the impulse noise components are of frequencies higher than the used frequency. Even without the provision of the capacitor, the noise components can be absorbed in the presence of a stray capacitance of the inductive load 2.

Figure 7:
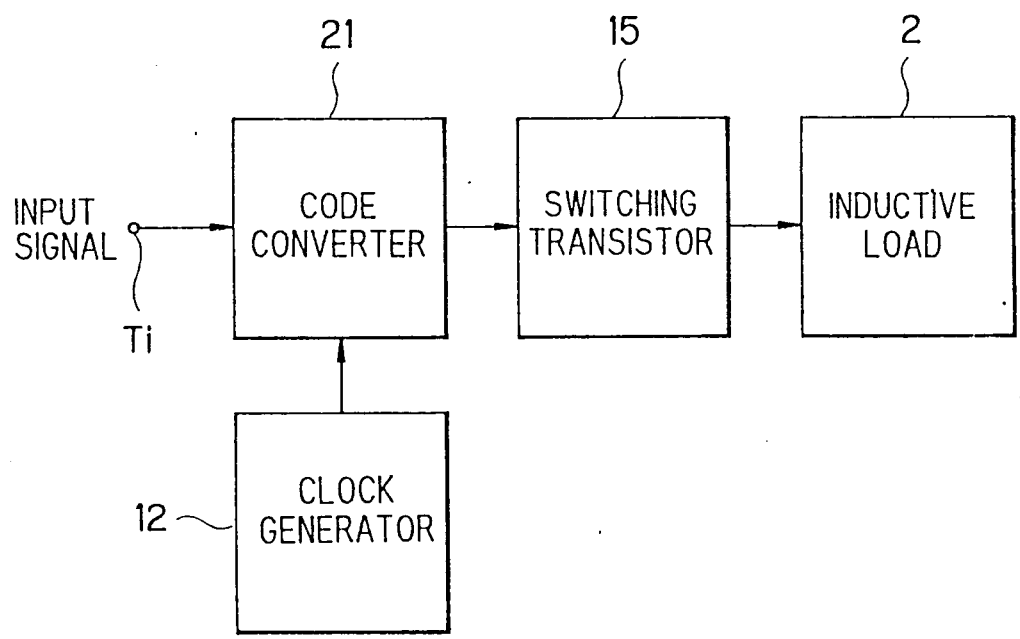
FIG. 7 is a block diagram showing a circuit for driving an inductive load in a second preferred embodiment according to the invention.

FIG. 7 shows a circuit for driving an inductive load in the second preferred embodiment according to the invention. The circuit for driving an inductive load comprises a code converter 21 connected to an input terminal Ti, a switching transistor 15 which is switched on and off by an output signal of the code converter 21, an inductive load 2 which is driven upon an application of a driving voltage, and a clock generator 12 for supplying a high speed clock signal in accordance with a sampling rate to the code converter 21.

In the second preferred embodiment, the code converter 21 is included in place of the high speed sampling circuit 11, the digital low pass filter 13, and the $\Delta\Sigma$ modulator 14 as used in the first preferred embodiment.

As described in the first embodiment, a first predetermined pulse train is generated in accordance with a digital processing effected in the high speed sampling circuit 11, the digital low pass filter 13, and the $\Delta\Sigma$ modulator 14 at each time, when the input signal rises from "low" to "high". The first predetermined pulse train is supplied to the switching transistor 15. In the same manner, a second predetermined pulse train which is opposite to the first predetermined pulse train is generated at each time, when the input signal falls from "high" to "low".

Such first and second predetermined pulse trains can be calculated beforehand, and stored into a ROM (read only memory). Therefore, the code converter 21 is realized by a ROM.

In operation in the second preferred embodiment, the input signal is applied to the input terminal Ti, so that a first predetermined pulse train of a PWM is generated in the code converter 21 in accordance with the clock signal from the clock generator 12, when the input signal rises from "low" to "high". The first predetermined pulse train is supplied to the switching transistor 15 which is thereby switched on, so that the inductive load 2 is driven upon an application of the driving voltage.

In the first and second preferred embodiments, the circuit for driving an inductive load may be modified without departing from the scope of the invention. For instance, the high speed sampling circuit 11 may be replaced by a zero data interpolation circuit in the first preferred embodiment.

As described above, D-class operation is carried out to decrease a power consumption substantially to zero in driving an inductive load by use of a switching transistor. Furthermore, harmonic noise which is difficult to be removed in a conventional circuit at the time of switching operation is avoided to be included in a frequency band used, for instance, in a magnetic recording and reproducing apparatus. This makes it possible to use a switching transistor even in a magnetic recording and reproducing apparatus, in which D-class operation is conventionally impossible due to noise of a switching transistor. Consequently, less power consumption is realized, and the construction becomes small in accordance with no necessity of heat radiation.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is

1. A circuit for driving an inductive load, comprising:
    means for supplying an input signal to an input terminal, said input signal being an instruction signal for driving said inductive load;
    means for generating a high speed clock signal having a predetermined sampling rate;
    switching signal generating means including a means for generating a pulse width modulation signal and a signal equivalent to said pulse with modulation signal and being connected to said supplying means and to said clock signal generating means, respectively, said switching signal generating means receiving said input signal and generating in accordance with said clock signal a switching signal selected from said pulse width modulation signal and said signal equivalent to said pulse width modulation signal each time when said input signal rises from a low value to a high value or falls from a high value to a low value; and
    a switching transistor connected to said switching signal generating means and which is turned on and off in response to said switching signal to drive said inductive load.

2. A circuit for driving an inductive load, according to claim 1, wherein said switching signal generating means includes:
    a high speed sampling circuit receiving said input signal and generating a pulse train in accordance with said high speed clock signal;
    a digital low pass filter connected to said sampling circuit for removing a predetermined frequency component of said pulse train providing a multi-bit signal; and
    a $\Delta\Sigma$ modulator receiving said multi-bit signal from said digital low pass filter and generating said pulse width modulation signal.

3. A circuit for driving an inductive load, according to claim 2, wherein said $\Delta\Sigma$ modulator includes an adder, first and second delay circuits, and a quantization circuit interconnected such that a first input terminal of said adder is connected to an output terminal of said digital low pass filter to receive said multi-bit signal therefrom, second and third input terminals of said adder are connected to output terminals of said first and second delay circuits, respectively, an output terminal of said adder is connected to input terminals of said second delay circuit and said quantization circuit, respectively, and an output terminal of said quantization circuit is connected to an input terminal of said first delay circuit and said switching transistor, respectively.

4. A circuit for driving an inductive load, according to claim 1, wherein
    said switching signal generating means includes a ROM storing said switching signal.

5. A circuit for driving an inductive load according to claim 2, wherein said sampling circuit has a set sampling frequency which is greater than twice a frequency band used in said inductive load.

* * * * *